United States Patent
Hanna et al.

(10) Patent No.: US 10,971,603 B2
(45) Date of Patent: Apr. 6, 2021

(54) WAVY CHANNEL FLEXIBLE THIN-FILM-TRANSISTOR ON A FLEXIBLE SUBSTRATE AND METHOD OF PRODUCING SUCH A THIN-FILM-TRANSISTOR

(71) Applicant: KING ABDULLAH UNIVERSITY OF SCIENCE AND TECHNOLOGY, Thuwal (SA)

(72) Inventors: Amir Nabil Hanna, BeniSuef (EG); Muhammad Mustafa Hussain, Austin, TX (US)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 16/486,107

(22) PCT Filed: Jan. 12, 2018

(86) PCT No.: PCT/IB2018/050207
§ 371 (c)(1),
(2) Date: Aug. 14, 2019

(87) PCT Pub. No.: WO2018/162993
PCT Pub. Date: Sep. 13, 2018

(65) Prior Publication Data
US 2020/0235223 A1    Jul. 23, 2020

Related U.S. Application Data

(60) Provisional application No. 62/468,608, filed on Mar. 8, 2017.

(51) Int. Cl.
*H01L 29/66* (2006.01)
*H01L 29/423* (2006.01)
(Continued)

(52) U.S. Cl.
CPC .... *H01L 29/6675* (2013.01); *H01L 21/28194* (2013.01); *H01L 21/3065* (2013.01); *H01L 29/4236* (2013.01); *H01L 29/78663* (2013.01)

(58) Field of Classification Search
CPC ......... H01L 29/7869–78696; H01L 29/78663; H01L 29/6675; H01L 29/785–78603;
(Continued)

(56) References Cited

U.S. PATENT DOCUMENTS

| 6,716,686 B1 | 4/2004 | Buynoski et al. |
| 2013/0175530 A1 | 7/2013 | Noda et al. |

(Continued)

FOREIGN PATENT DOCUMENTS

WO    2016140975 A1    9/2016

OTHER PUBLICATIONS

Aerts, W.F., et al., "Design of an Organic Pixel Addressing Circuit for an Active-Matrix OLED Display," IEEE Transactions on Electron Devices, vol. 49, No. 12, Dec. 2002, pp. 2124-2130.
(Continued)

*Primary Examiner* — Jose R Diaz
(74) *Attorney, Agent, or Firm* — Patent Portfolio Builders PLLC

(57) ABSTRACT

A method for producing a thin-film-transistor involves forming a flexible substrate on a rigid substrate, forming a plurality of fins and trenches in a structural layer arranged on the flexible substrate, forming a wavy gate layer, channel layer, source contact layer, and drain contact layer on each of the plurality of fins and each of a plurality of trenches of the structural layer, and removing the plurality of fins and trenches having the wavy gate, channel, source contact, and drain contact layers from the rigid substrate.

18 Claims, 11 Drawing Sheets

(51) Int. Cl.
*H01L 29/786* (2006.01)
*H01L 21/28* (2006.01)
*H01L 21/3065* (2006.01)

(58) Field of Classification Search
CPC ........... H01L 29/4238; H01L 29/42384; H01L 51/0097; H01L 29/66787; H01L 29/4236; H01L 29/78696; H01L 21/28194; H01L 21/3065; H01L 21/4236
See application file for complete search history.

(56) References Cited

U.S. PATENT DOCUMENTS

| | | | |
|---|---|---|---|
| 2016/0365459 A1 | 12/2016 | Hong et al. | |
| 2020/0243371 A1* | 7/2020 | Yasumoto | ........... H01L 21/6836 |

OTHER PUBLICATIONS

Baek, G., et al., "Scaling of Coplanar Homojunction Amorphous In—Ga—Zn—O Thin-Film Transistors," Japanese Journal of Applied Physics, vol. 52, 2013 (Published online Mar. 21, 2013), pp. 03BB05-1-03BB05-5 (6 pages total).
Ban, A., et al., "Development of a Super-High-Definition TFT LCD (28-inch QSXGA)," Sharp Technical Journal, vol. 3, 2001, pp. 1-5.
Chansin, G., et al., "OLED Display Forecasts 2016-2026: The Rise of Plastic and Flexible Displays: Technology analysis and detailed forecasts by market segment and display type," IDTECHEX Research Report, 2016 (accessed Feb. 2017), pp. 1-16.
Chen, C., et al., "Amorphous In—Ga—Zn—O Thin Film Transistor Current-Scaling Pixel Electrode Circuit for Active-Matrix Organic Light-Emitting Displays," Japanese Journal of Applied Physics, vol. 48, 2009 (Published online Mar. 23, 2009), pp. 03B025-1-03B025-7.
Han, M.-K., "AM backplane for AMOLED," Proc. of ASID '06, Oct. 8-12, 2006, pp. 53-58.
Hanna, A.N., et al., "Zinc Oxide Integrated Wavy Channel Thin-Film Transistor-Based High-Performance Digital Circuits," IEEE Electron Device Letters, vol. 37, No. 2, Feb. 2016 (Published Dec. 4, 2015; date of current version Jan. 25, 2016), pp. 193-196.
Hoffman, R.L., "ZnO-channel thin-film transistors: Channel mobility," Journal of Applied Physics, vol. 95, No. 10, May 15, 2004 (Published online May 6, 2004), pp. 5813-5819 (8 pages total).
Hsieh, H.-H., et al., "Scaling behavior of ZnO transparent thin-film transistors," Applied Physics Letters, vol. 89, 2006 (Published online Jul. 25, 2006), pp. 041109-1-041109-3 (4 pages total).
Hwang, C.-S., et al., "Vertical Channel ZnO Thin-Film Transistors Using an Atomic Layer Deposition Method," IEEE Electron Device Letters, vol. 35, No. 3, Mar. 2014 (Published Jan. 23, 2014; date of current version Feb. 20, 2014), pp. 360-362.
Jeon, S., et al., "Short channel device performance of amorphous InGaZnO thin film transistor," Applied Physics Letters, vol. 99, 2011 (Published online Aug. 23, 2011), pp. 082104-1-082104-3 (4 pages total).
Jeong, J., et al., "Scaling behaviour of a-IGZO TFTs with transparent a-IZO source/drain electrodes," Journal of Physics D: Applied Physics, vol. 45, 2012 (Published Mar. 15, 2012), pp. 1-5 (6 pages total).
Kamiya, T., et al., "Present status of amorphous In—Ga—Zn—O thin-film transistors," Science and Technology of Advanced Materials, vol. 11, 2010 (Published Sep. 10, 2010), pp. 1-23 (24 pages total).

Lee, H., et al., "Current-Scaling a-Si:H tft Pixel-Electrode Circuit for AM-OLEDs: Electrical Properties and Stability," IEEE Transactions on Electron Devices, vol. 54, No. 9, Sep. 2007, pp. 2403-2410.
Lee, S., et al., "Channel scaling behavior of amorphous In—Zn—O thin film transistors with high mobility over 35 cm2/Vsec," ECS Transactions, vol. 72, No. 5, 229th ECS Meeting, May 29, 2016-Jun. 2, 2016, pp. 59-65.
Münzenrieder, N., et al., "Flexible Self-Aligned Double-Gate IGZO TFT," IEEE Electron Device Letters. vol. 35, No. 1, Jan. 2014 (Published Nov. 25, 2013; date of current version Dec. 20, 2013), pp. 69-71.
Ortiz-Conde, A., et al., "A review of recent MOSFET threshold voltage extraction methods," Microelectronics Reliability, vol. 42, Issues 4-5, Apr.-May 2002, pp. 583-596.
Petti, L., et al., "Mechanically flexible vertically integrated a-IGZO thin-film transistors with 500 nm channel length fabricated on free standing plastic foil," IEEE International Electron Devices Meeting (IEDM), Dec. 2013, pp. 11.4.1-11.4.4.
Schroder, D.K., "Semiconductor Material and Device Characterization," Third Edition, IEEE Press, 2006, pp. 165-522 (60 pages total).
Smith, J.T., et al., "Application of Flexible OLED Display Technology for Electro-Optical Stimulation and/or Silencing of Neural Activity," Journal of Display Technology, vol. 10, No. 6, Jun. 2014 (Published Feb. 26, 2014; date of current version May 20, 2014), pp. 514-520.
Xu, Y., et al., "On the Origin of Improved Charge Transport in Double-Gate In—Ga—Zn—O Thin-Film Transistors: A Low-Frequency Noise Perspective," IEEE Electron Device Letters, vol. 36, No. 10, Oct. 2015 (Published Aug. 12, 2015; date of current version Sep. 23, 2015), pp. 1040-1043.
Yu, X., et al., "Metal oxides for optoelectronic applications," Nature Materials, vol. 15, Apr. 2016 (Published online Mar. 23, 2016), pp. 383-396.
Hanna, A.N., et al., "Area and Energy Efficient High-Performance ZnO Wavy Channel Thin-Film Transistor," IEEE Transactions on Electron Devices, Sep. 2014, vol. 61, No. 9, pp. 3223-3228.
Hanna, A.N., et al., "Wavy Architecture Thin-Film Transistor for Ultrahigh Resolution Flexible Displays," Small, Nov. 13, 2017, vol. 14, No. 1, pp. 1703200.
Hanna, A.N., et al., "Wavy Channel Architecture Thin Film Transistor (TFT) Using Amorphous Zinc Oxide for High-Performance and Low-Power Semiconductor Circuits," 2015 73rd Annual Device Research Conference (DRC), IEEE, Jun. 21, 2015, pp. 201-202.
Hanna, A.N., et al., "Wavy Channel TFT Architecture for High Performance Oxide Based Displays," ECS Transactions, Jun. 11, 2015, 67, pp. 191-198, The Electrochemical Society.
Hanna, A.N., et al., "Wavy Channel TFT-Based Digital Circuits," IEEE Transactions on Electron Devices, Apr. 1, 2016, vol. 63, No. 4, pp. 1550-1556.
Hanna, A.N., et al., "Wavy Channel Thin Film Transistor Architecture for Area Efficient, High Performance and Low Power Displays," Physica Status Solidi, Rapid Research Letters, Dec. 23, 2013, Wiley Online Library, WILEY-VCH Verlag GmbH & Co.
Hanna, A.N., et al., "Zinc Oxide Integrated Area Efficient High Output Low Power Wavy Channel Thin Film Transistor," Applied Physics Letters, Nov. 26, 2013, vol. 103, 224101.
International Search Report in corresponding/related International Application No. PCT/IB2018/050207, dated Apr. 17, 2018.
Torres Sevilla, Galo A., et al., "Flexible Nanoscale High-Performance FinFETs," ACS Nano, Sep. 3, 2014, vol. 8, No. 10, pp. 9850-9856.
Written Opinion of the International Searching Authority in corresponding/related International Application No. PCT/IB2018/050207, dated Apr. 17, 2018.

\* cited by examiner

BACKGROUND ART

WAVY CHANNEL FLEXIBLE THIN-FILM-TRANSISTOR ON A FLEXIBLE SUBSTRATE AND METHOD OF PRODUCING SUCH A THIN-FILM-TRANSISTOR

CROSS-REFERENCE TO RELATED APPLICATIONS

This application is a U.S. National Stage of International Application No. PCT/IB2018/050207, which claims priority to U.S. Provisional Patent Application No. 62/468,608, filed on Mar. 8, 2017, entitled "FLEXIBLE WAVY CHANNEL TRANSISTOR ARCHITECTURE FOR HIGH PERFORMANCE DISPLAYS," the disclosures of which are incorporated here by reference in their entirety.

BACKGROUND

Technical Field

Embodiments of the subject matter disclosed herein generally relate to a wavy channel thin-film-transistor on a flexible substrate and a method for producing such a wavy channel thin-film-transistor.

Discussion of the Background

There is an ever-increasing demand for improving the resolution of displays by increasing the number of displayable pixels. While displays capable of driving an 800 pixel×600 pixel resolution were standard for a long time, display resolutions have quickly increased to so-called high definition resolutions of 1280 pixels×720 pixels, 1280 pixels×768 pixels, and 1280 pixels×1024 pixels. Displays capable of achieving so-called 4K resolution, due to the use of approximately 4,000 pixels, are now becoming more and more affordable and there is an increasing demand for displays capable of 8K resolution.

Increasing display resolution requires increasing the number of displayable pixels. When the dimensions of a display are maintained, increasing the number of displayable pixels requires reducing the size of each pixel. Specifically, active-matrix displays, such as active-matrix liquid crystal display (AM-LCD) displays and active-matrix organic light emitting diode (AM-OLED) displays, contain an active-matrix backplane of thin-film-transistor (TFT) pixel circuits. Active-matrix displays thin-film-transistor pixel circuits, which control individual OLED or LCD pixels, typically include four thin-film-transistors and two capacitors. Accordingly, a smaller thin-film-transistor area is required for achieving both higher resolutions, as well as high pixel fill factors, which is defined as the ratio of the light emitting area over the total area of the pixel.

Another important motivation for scaling thin-film-transistors is that the allowed pixel size decreases as the number of Pixel Per Inch (PPI) increases, which is a critical requirement for future high resolution mobile displays, such as flexible displays for point-of-care medical diagnostic testing. For example, the pixel size for 500 PPI is only 50.8× 16:9 μm. Accordingly, there is a need to scale down the size of thin-film-transistors consistent with the reduced pixel size so that the thin-film-transistor pixel circuits can fit within the smaller pixel area.

FIGS. 1A and 1B are schematic diagrams of a top view and perspective view of a conventional coplanar thin-film-transistor on a flexible substrate. The coplanar thin-film-transistor 100 includes a channel 102 arranged between a source contact 104 and drain contact 106, all of which are arranged on a flexible substrate 108. As illustrated in FIG. 1B, an insulating layer 110 is arranged between the gate layer (not visible in the Figures) and the channel 102, source contact 104, and drain contact 106. The top of the thin-film-transistor is relatively flat.

Gate length scaling is a common technique to reduce the area occupied by the thin-film-transistors comprising a pixel circuit. There are, however, limits to gate length scaling. For example, scaling gates comprised of indium gallium zinc oxide (commonly referred to as IGZO) below 5 μm induces short-channel effects, such as negative voltage threshold $V_T$ values, higher OFF current, higher subthreshold slope, lower output resistance, and lower saturation field effect mobility. The short-channel effects also result in higher static power consumption, as well as lower frame rates for scaled down pixels due to lower switching speed caused by mobility degradation.

One attempt to mitigate short-channel effects is to employ a double-gate thin-film-transistor architecture, which exhibits higher transconductance and lower subthreshold values when compared to a single gate architecture. Double-gate thin-film-transistors, however, are more complex to integrate due to the added requirement to align both gates, as well as high cost per transistor, which can be cost-prohibitive for large-area displays. Further, IGZO-based double-gate thin-film-transistors still exhibit negative voltage threshold $V_T$ values for gate lengths below 5 μm.

Accordingly, there is a need for a flexible thin-film-transistor that can be scaled down in size without introducing short-channel effects.

SUMMARY

According to an embodiment, there is a method for producing a thin-film-transistor, which involves forming a flexible substrate on a rigid substrate, forming a plurality of fins and trenches in a structural layer arranged on the flexible substrate, forming a wavy gate layer, channel layer, source contact layer, and drain contact layer on each of the plurality of fins and each of a plurality of trenches of the structural layer, and removing the plurality of fins and trenches having the wavy gate, channel, source contact, and drain contact layers from the rigid substrate.

According to another embodiment there is a thin-film-transistor, which includes a flexible substrate, a structural layer attached to the flexible substrate, wherein the structural layer includes a plurality of fins and a trench between each of the plurality of fins, and a wavy gate layer, channel layer, source contact layer, and drain contact layer formed on the plurality of fins and the trench between each of the plurality of fins.

According to a further embodiment there is a method for producing a thin-film transistor, which involves forming a flexible substrate on a rigid substrate, forming a plurality of fins and trenches in an amorphous silicon layer arranged on the flexible substrate, forming a wavy gate layer on each of the plurality of fins and each of a plurality of trenches of the amorphous silicon layer, forming a wavy channel layer on each of the plurality of fins and each of a plurality of trenches of the amorphous silicon layer, forming a wavy source contact layer and a wavy drain contact layer on lateral ends of each of the plurality of fins and each of a plurality of trenches of the amorphous silicon layer, and removing the plurality of fins and trenches having the wavy gate, channel, source contact, and drain contact layers from the rigid substrate.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of thin-film-transistors used in displays. However, the embodiments to be discussed next are not limited to thin-film-transistors used in displays but instead the embodiments can be employed in connection with other applications of thin-film-transistors.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1A:
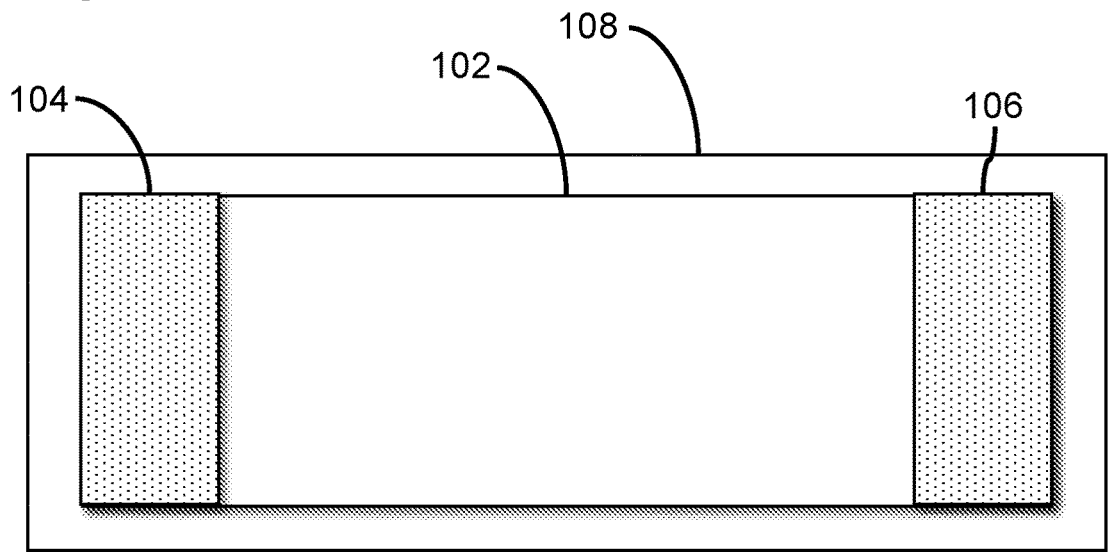
FIG. 1A is a schematic diagram of a top view of a conventional coplanar thin-film-transistor on a flexible substrate.
Figure 1B:
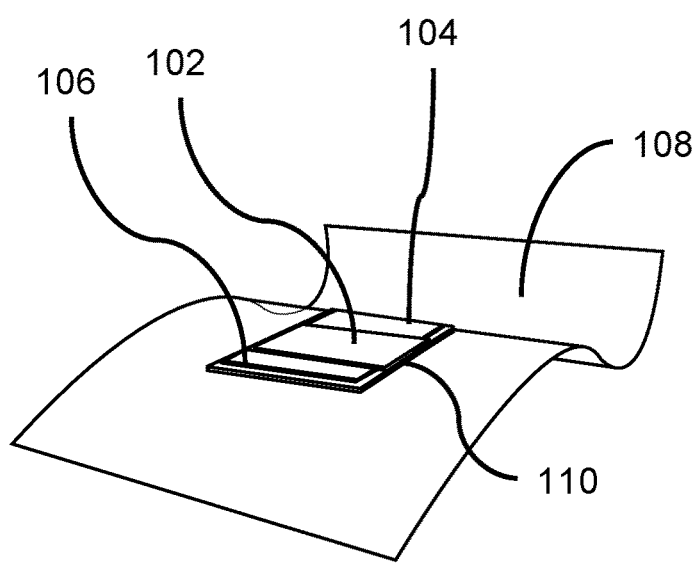
FIG. 1B is a schematic diagram of a perspective view of a conventional coplanar thin-film-transistor on a flexible substrate.
Figure 2:
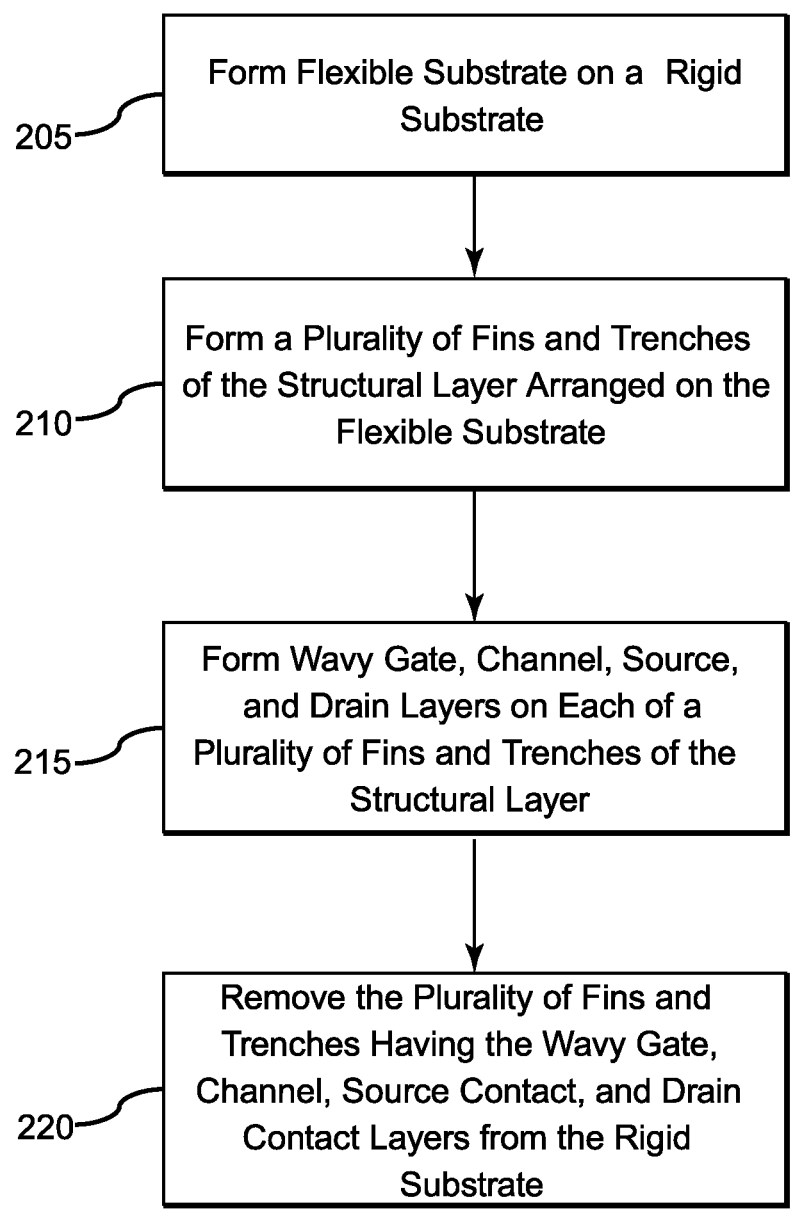
FIG. 2 is a flowchart of a method for producing a wavy channel thin-film-transistor on a flexible substrate according to an embodiment.

Referring now to FIG. 2, according to an embodiment a method for producing a thin-film-transistor comprises forming a flexible substrate on a rigid substrate (step 205) and then forming a plurality of fins and trenches in a structural layer arranged on the flexible substrate (step 210). The method further comprises forming a wavy gate layer, channel layer, source contact layer, and drain contact layer on each of the plurality of fins and each of a plurality of trenches of the structural layer (step 215). The method also comprises removing the plurality of fins and trenches having the wavy gate, channel, source contact, and drain contact layers from the rigid substrate (step 220). The transistor formed by this method can be referred to as a wavy channel thin-film-transistor due to the formation of the channel on the plurality of fins and trenches.

Figure 3A:
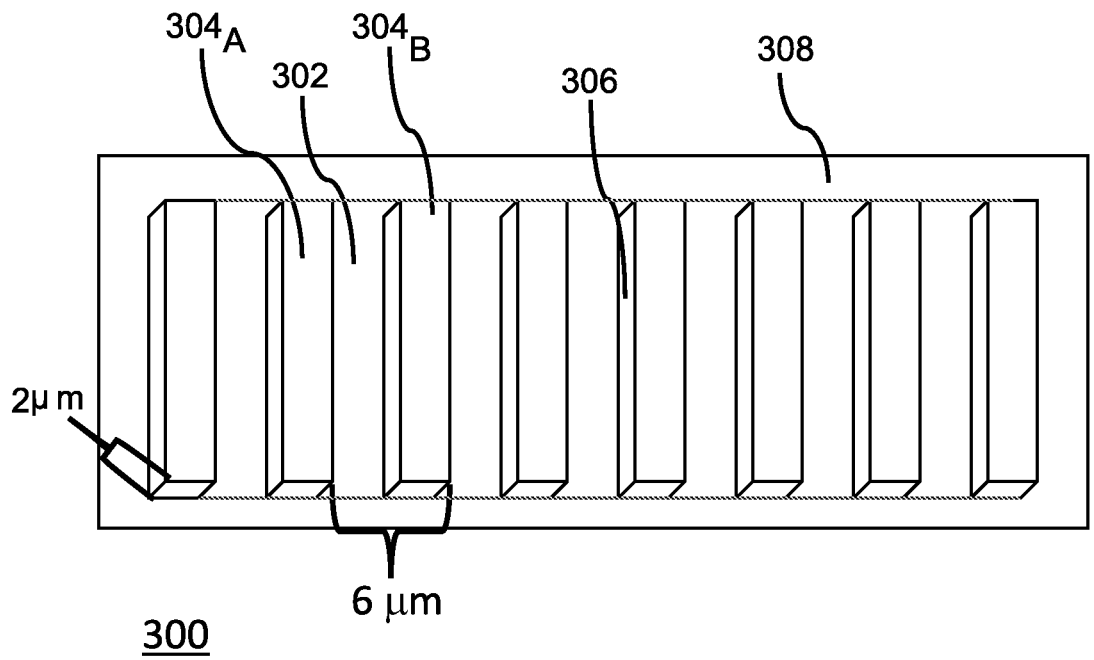
FIG. 3A is a schematic diagram of a top view of a channel support structure of a wavy channel thin-film-transistor on a flexible substrate according to an embodiment.
Figure 3B:
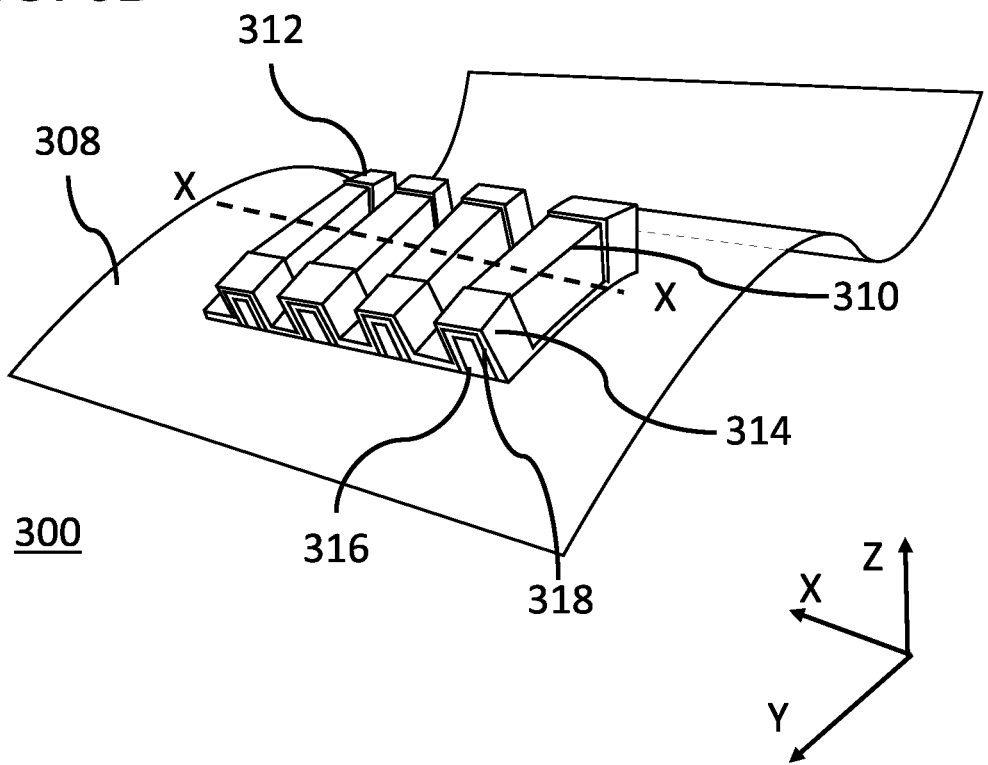
FIG. 3B is a schematic diagram of a perspective view of a wavy channel thin-film-transistor on a flexible substrate according to an embodiment.
Figure 3C:
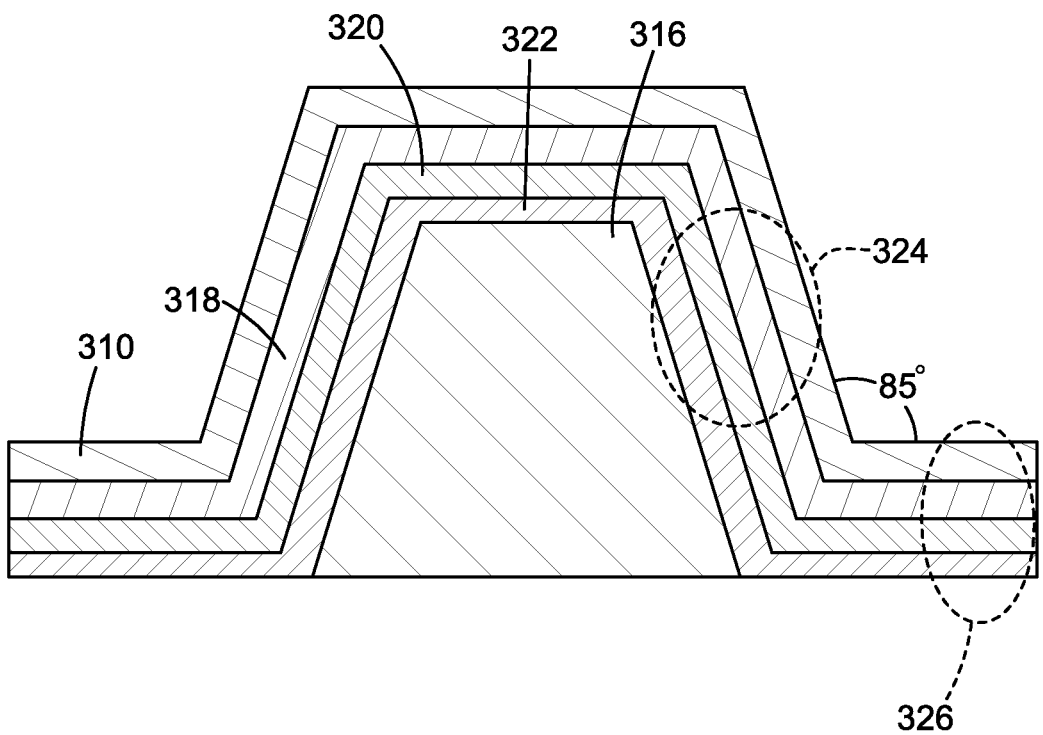
FIG. 3C is a schematic diagram of a cross-sectional view of a wavy channel thin-film-transistor on a flexible substrate according to an embodiment.

FIGS. 3A, 3B, and 3C are schematic diagrams of a top view, perspective view, and side view of a wavy channel thin-film-transistor on a flexible substrate according to an embodiment. The schematic diagram of FIG. 3A illustrates the channel support structure (i.e., the structural layer) without the active areas (i.e., gate, source, drain, and channel) of the thin-film transistor. As illustrated in FIG. 3A, the channel support structure of the thin-film-transistor 300 includes a plurality of fins 304A and 304B (only two of which are labeled for purposes of clarity), between which there are trenches 302. In the illustrated example the width of the individual fins, i.e., the size in the z-axis, are 2 µm and the fin pitch is 6 µm. Of course, other widths and pitches can be employed. The entire channel support structure is arranged on a flexible substrate 308.

Referring now to FIGS. 3B and 3C, which show some of the active areas of the transistor, the lateral ends of the fins and trenches support source and drain contacts 312 and 314, between which a channel 310 is formed on the fins and trenches. The channel 310 and source and drain contacts 312 and 314 are arranged on a gate dielectric layer 318, which is formed directly on the fins and trenches. All of these components are arranged on an amorphous silicon layer 316, which forms a structural layer in which the fins and trenches are formed.

As illustrated in FIG. 3C, a gate metal layer 320 is arranged between the gate dielectric layer 318 and an insulating layer 322, which is directly adjacent to the amorphous silicon layer 316. Because FIG. 3C is a cross-sectional view of FIG. 3B along the X-X line passing through the channel 310, the source and drain contacts 312 and 314 are not illustrated in this figure. FIG. 3C also illustrates the fin 304A having a non-perpendicular sidewall 324 to the trench bottom 326, which in the illustrated example is at 85° angle.

Although the fin sidewall 324 can be arranged at a variety of different angles to the trench bottom 326, including being perpendicular to the trench bottom 326, an angled side-wall improves the deposition of the various layers because there is no scalloping effect, whereas fin sidewalls 324 arranged perpendicularly to the trench bottom 326 exhibit a scalloping effect that can be detrimental to the deposition of the various layers. Those skilled in the art will recognize that scalloping occurs in the deep reactive ion etching process, also known as the Bosch process, due to consecutive steps of sidewall passivation and anisotropic etching processes, which results in a 90° sidewall angle. By avoiding the sidewall passivation step, the disclosed device has a non-perpendicular sidewall angle, such as 85°. The conformal deposition and smooth side-walls of the angled fins mitigate problems arising in typical nonplanar thin-film-transistor architectures, such as vertical thin-film-transistor architecture, which suffer from both higher gate leakage and gate-to-source/drain overlap parasitic capacitance. Further, the process flow is compatible with self-aligned source and drain deposition techniques.

A thin-film-transistor with fins and trenches is formed in the manner disclosed by increasing the width (i.e., the distance in a direction perpendicular to a top surface of the transistor) compared to the width of conventional coplanar thin-film-transistors. The fins and trenches improve the overall electrical characteristics of the device. Specifically, the increased width allows the use of the smallest reliable gate length without changing the threshold voltage $V_T$ or off current $I_{OFF}$. This allows a reduction in the other dimensions of the thin-film-transistor, which allows smaller thin-film-transistor pixel circuits and more dense pixel arrangements. A thin-film-transistor produced in the manner disclosed was arranged to drive a light emitting diode (LED), which showed 70% higher currents compared to conventional coplanar thin-film-transistors integrated on the same substrate as the disclosed flexible substrate. The 70% higher currents are due to the 70% larger width of the channel compared to coplanar devices due to the disclosed device having 2 µm high fins and 6 µm fin pitch.

Figure 4:
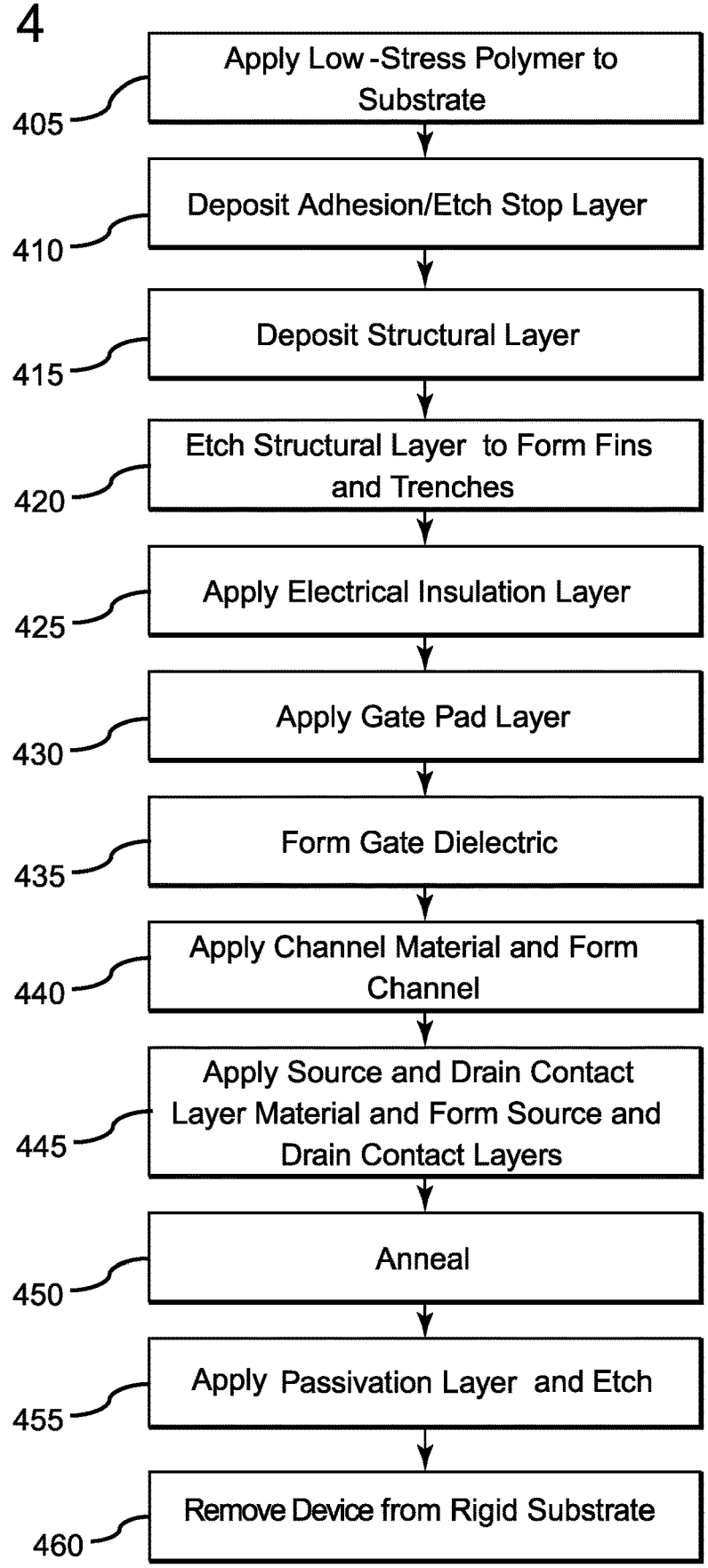
FIG. 4 is a flowchart of a method for producing a wavy channel thin-film-transistor on a flexible substrate according to an embodiment.
Figure 5A:
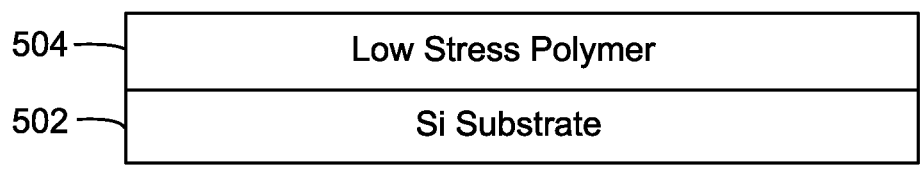
FIGS. 5A-5L are schematic diagrams of a method for producing a wavy channel thin-film-transistor on a flexible substrate according to an embodiment.
Figure 5B:
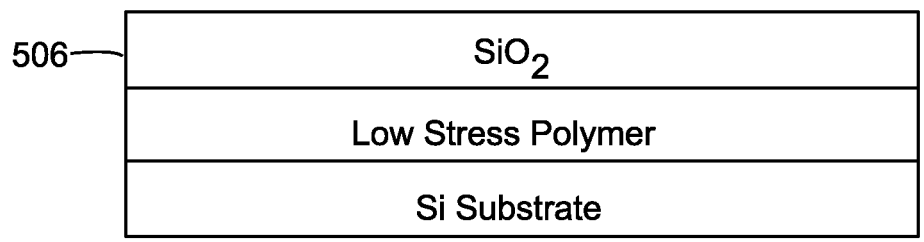

A more detailed explanation of a method of producing a wavy channel thin-film-transistor will now be described in connection with FIGS. 4 and 5A-5L. Referring initially to FIGS. 4 and 5A, a low stress polymer 504, such as polyimide PI-6211 from DuPont, is spun on a rigid Si substrate 502, for example at 2000 RPM, and then cured, for example at 360° C. (step 405). In one embodiment, the low stress polymer layer can be 9 µm thick. The low stress polymer layer acts as a flexible substrate for the wavy channel thin-film-transistor after it is removed from the rigid Si substrate 502. A silicon dioxide ($SiO_2$) adhesion and etch stop layer 506 is deposited using plasma enhanced chemical vapor deposition (step 410 and FIG. 5B). The silicon dioxide layer 506 acts as an adhesion layer and etch stop layer for the following layer. The silicon dioxide layer 506 can have a thickness of, for example, 200 nm.

Figure 5C:
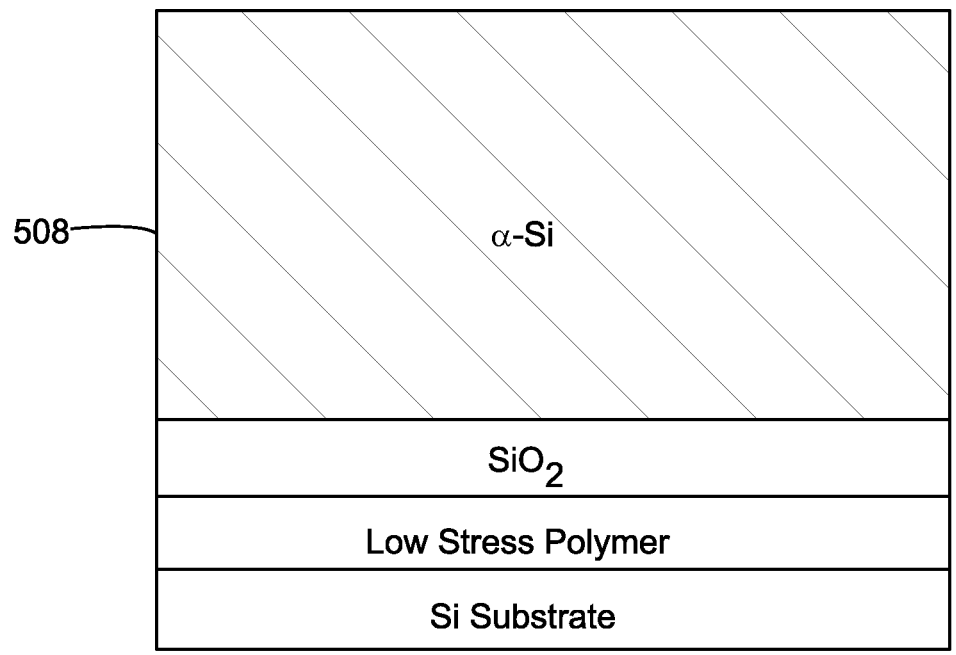
Figure 5D:
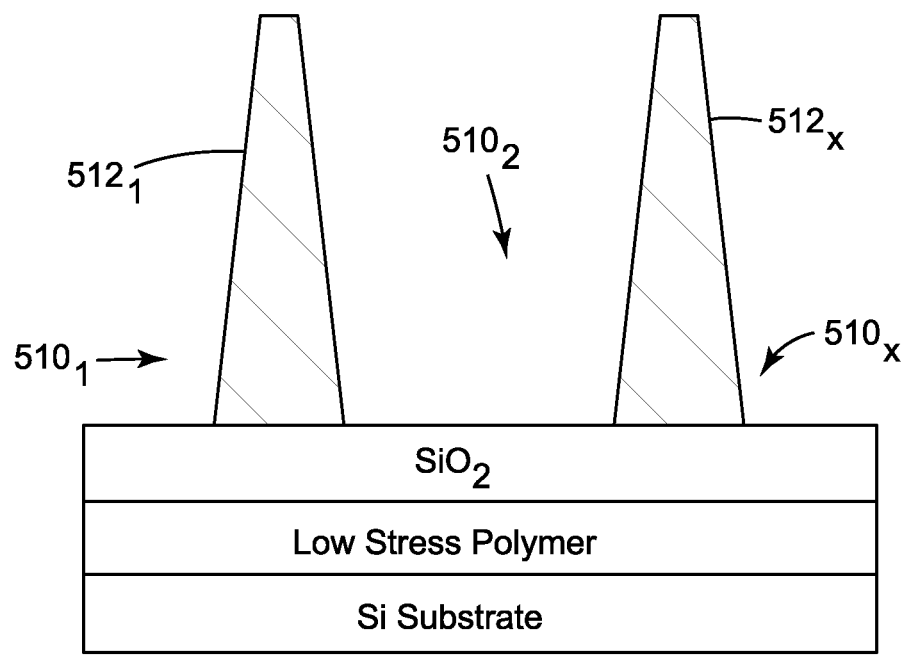

An amorphous silicon layer 508 is then deposited, for example at 250° C., which acts as the structural layer for the subsequent formation of the fins and trenches (step 415 and FIG. 5C). The amorphous silicon layer 508 is then etched to form a plurality of trenches $510_1$-$510_X$ and a plurality of fins $512_1$-$512_X$ (step 420 and FIG. 5D). For example, the amorphous silicon layer 508 can be 2 µm thick and can be etched using $SF_6$ based reactive ion etching. As discussed above, the sidewalls of the fins can be perpendicular to the bottom of the trenches or can be at an angle, such as an 85° angle. These figures illustrate only two fins and three trenches for purposes of clarity and a single transistor can have more fins and trenches than those illustrated.

Figure 5E:
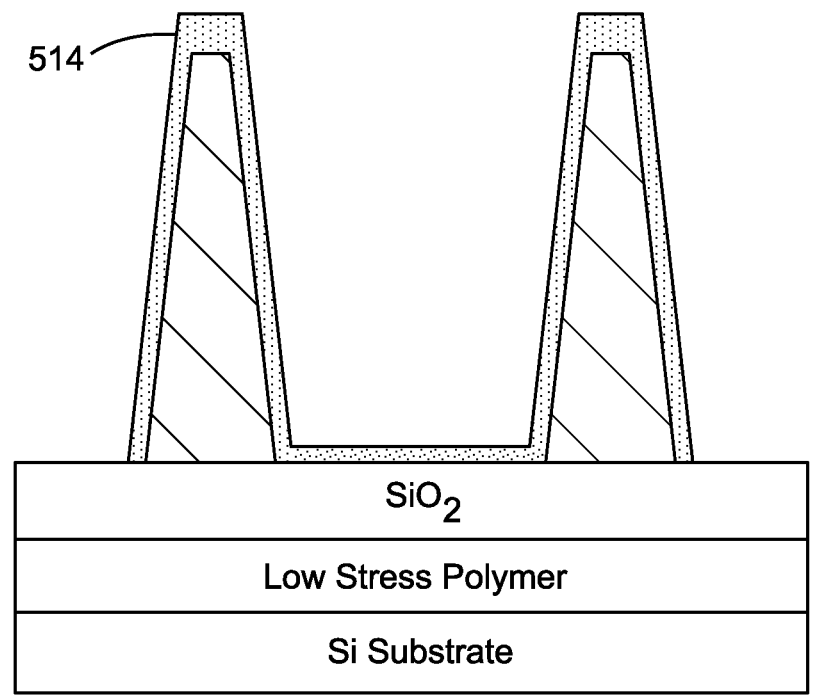
Figure 5F:
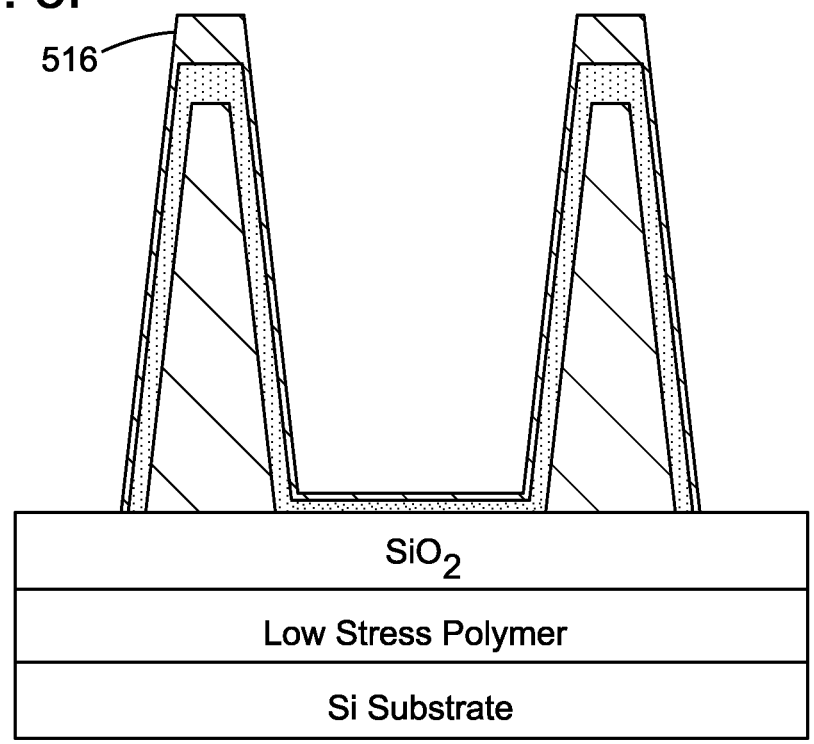

An electrical insulation layer 514, for example an $Al_2O_3$ layer, is deposited on the fins and trenches using atomic layer deposition (ALD) in order to electrically insulate the devices from the amorphous silicon structural layer (step 425 and FIG. 5E). The electrical insulation layer can be, for example, 50 nm thick. A gate pad layer 516, for example an aluminum layer, is then deposited using DC magnetron sputtering and then patterned using, for example, a lift-off technique (step 430 and FIG. 5F). The gate pad layer 516 can be, for example, 200 nm thick.

Figure 5G:
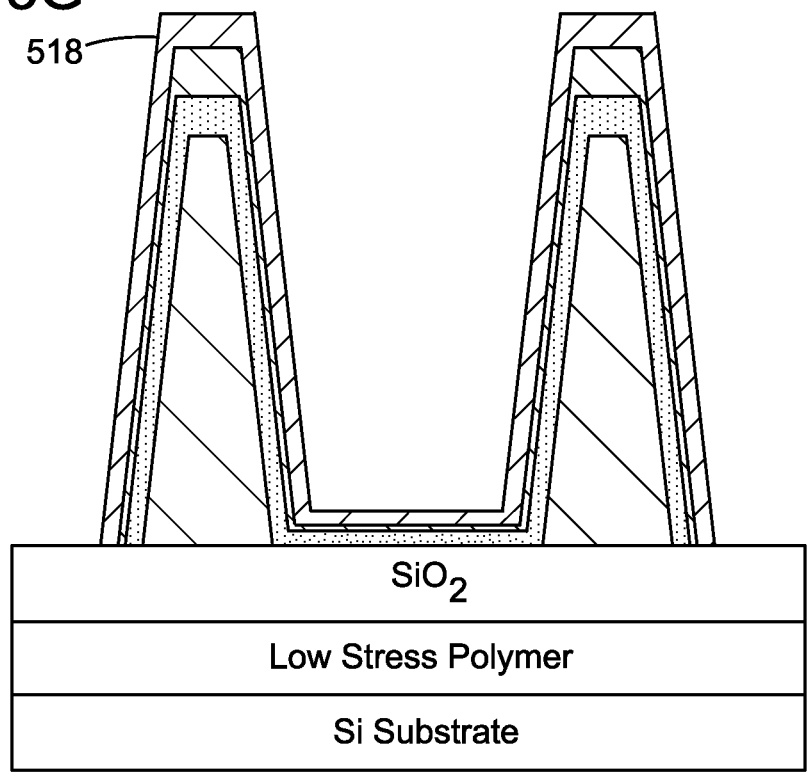
Figure 5H:
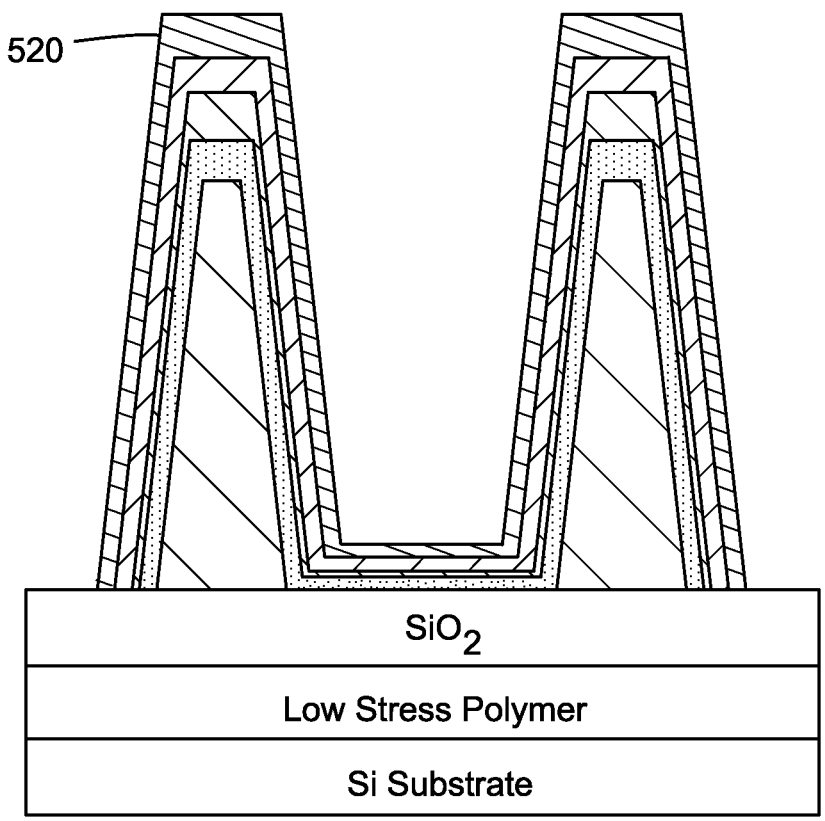

The wafer is again loaded in the atomic layer deposition chamber where a gate dielectric 518 is formed (step 435 and FIG. 5G). The gate dielectric layer can be comprised of, for example, $Al_2O_3$ and can be, for example, 50 nm thick. While the wafer is still in the atomic layer deposition chamber and without breaking the vacuum of the chamber, the channel is formed by applying a channel material 520 (step 440 and FIG. 5H). The channel can comprise, for example, zinc oxide (ZnO), and can be, for example, 40 nm thick. The wafer is then removed from the atomic layer deposition chamber and patterned, for example using buffered oxide etchant (BOE) for a period of time, such as 10 seconds.

Zinc oxide is a particularly advantageous channel material because it can achieve a highly uniform/conformal deposition using atomic layer deposition, which provides more uniform electrical properties across the wafer. However, the fin and trench structure is compatible with other channel deposition methods, such as DC or RF magnetron sputtering, because the angled fin side-wall allows for ample coverage of sputtered species, such as DC sputtered aluminum. Thus, the disclosed thin-film-transistor is agnostic to channel material, and other possible channel materials deposited by other deposition methods can include indium gallium zinc oxide (IGZO), indium zinc oxide (IZO), etc.

Figure 5I:
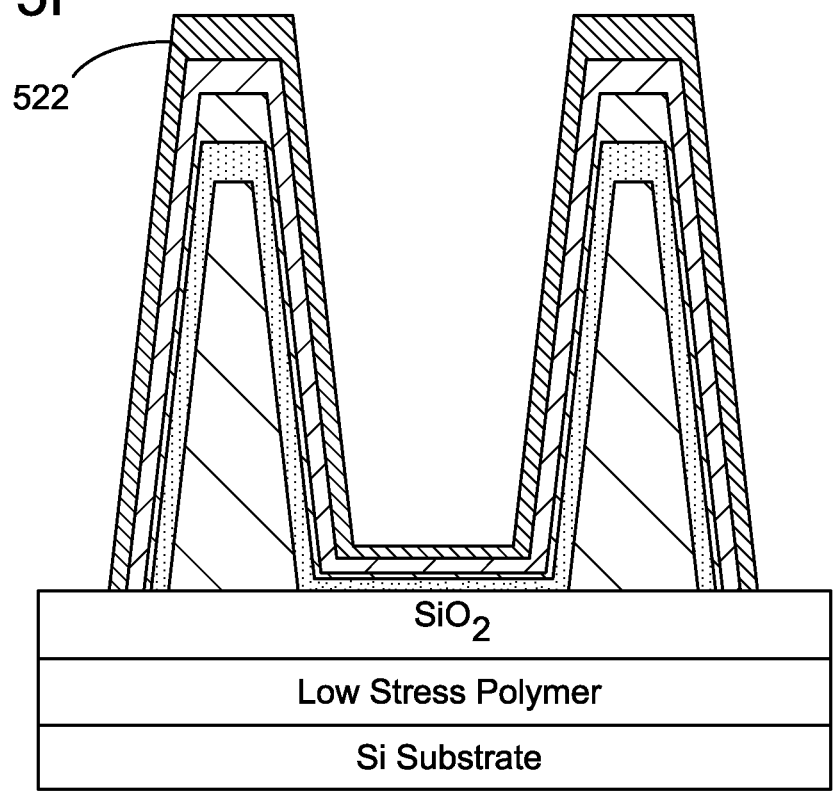
Figure 5J:
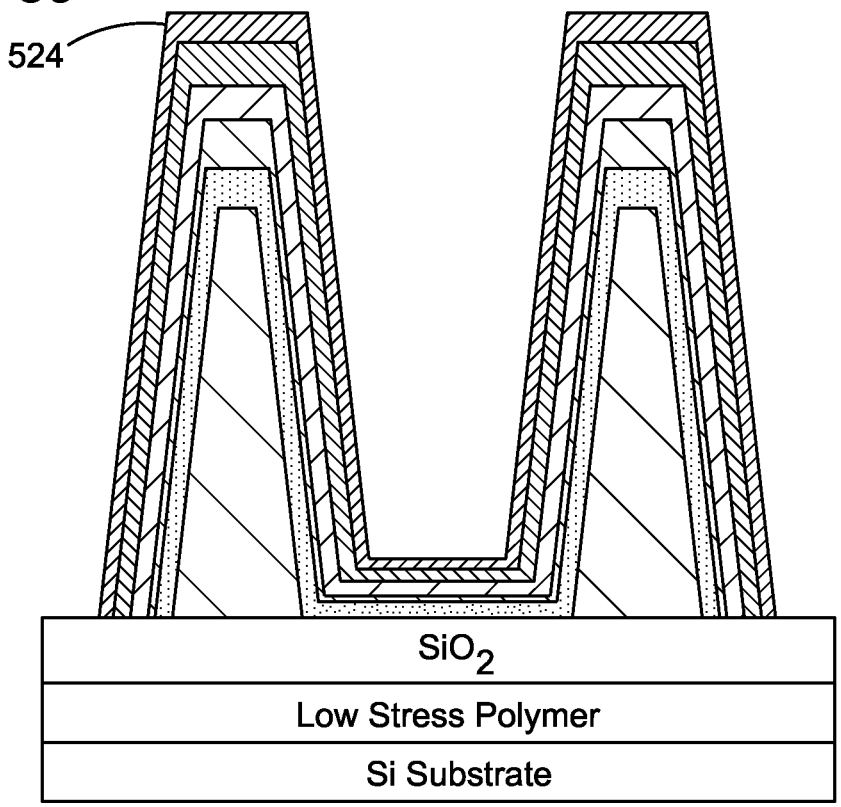
Figure 5K:
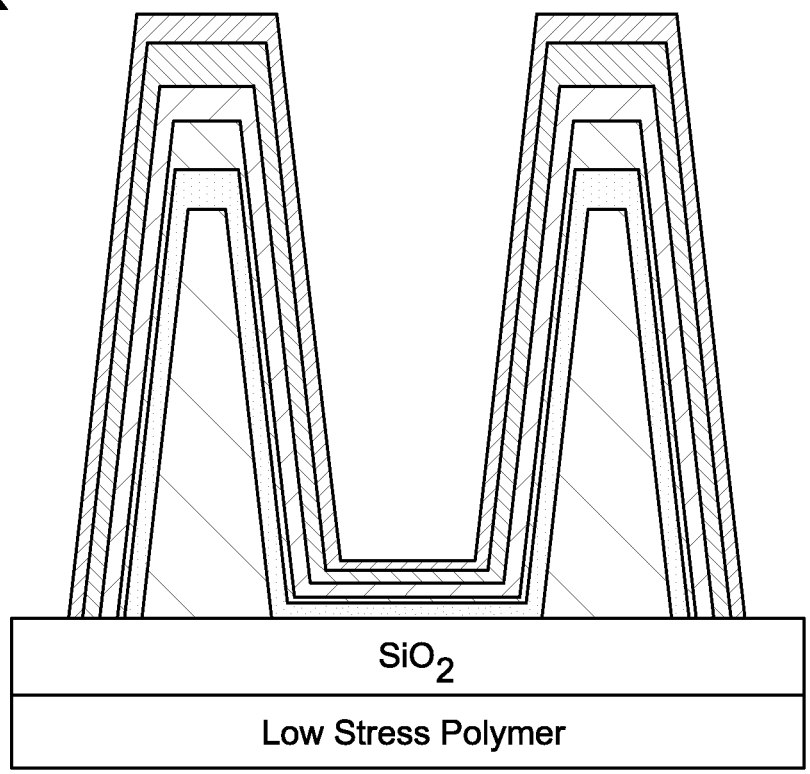
Figure 5L:
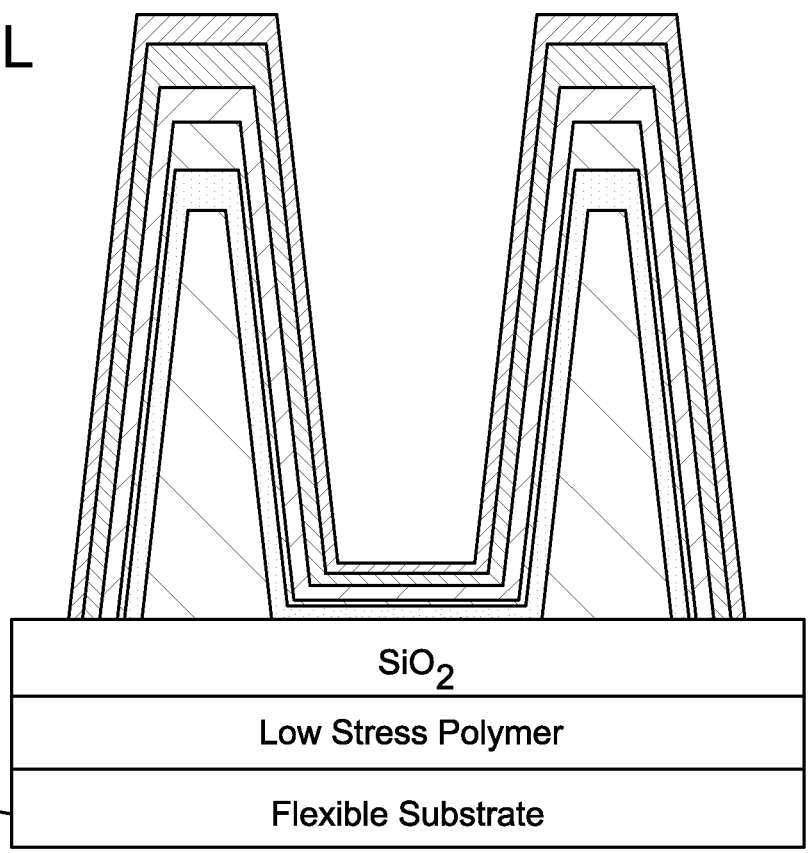

The source and drain contact layers 522 are then formed and patterned, for example using a lift-off technique (step 445 and FIG. 5I). The source and drain contact layers can be formed using DC sputtering by depositing, for example, 50 nm of titanium and 200 nm of gold. It should be recognized that because FIG. 5I is a side view, only one of the source and drain contact layers is visible, and also the channel is not visible because the source and drain contact layers are formed on the lateral ends of the device.

The device is then annealed in air, for example at 200° C. for 1 hour, to improve the electrical characteristics (step 450). A passivation layer 524 is then applied to protect the channel from environmental degradation and the gate oxide is etched to allow access to the gate pads (step 455 and FIG. 5J). The passivation layer 524 can be an organic or inorganic passivation layer. Finally, the device is removed from the rigid silicon substrate (step 460 and FIG. 5K). In order to simplify handling of the device, the device can be transferred to an additional flexible substrate 526 (FIG. 5L), which is an optional step not illustrated in FIG. 4.

A wavy channel thin-film transistor produced by the disclosed process was tested along with a conventional coplanar thin-film-transistor to compare the performance of the two devices. Both devices exhibited a $V_{ON} \cong 2.2V$, which is defined as the voltage at which the drain current increases exponentially from the noise floor, i.e., gate leakage.

The threshold voltage $V_T$ of both devices was extracted in the saturation regime from the point of the highest first derivative of $\sqrt{I_{ds}}$ versus $V_{gs}$ curve. The coplanar and wavy channel thin-film-transistors threshold voltage $V_T$ values were 6.6V and 4.2V, respectively. Output characteristics demonstrated 70% higher drain current values for wavy channel device compared to the coplanar device, which is proportional to the extra device width of the wavy channel thin-film-transistor. Minimum subthreshold slope (SS) values for coplanar and wavy channel devices were 0.4 and 0.2 V/decade, respectively. The lower SS and $V_T$ values for wavy channel thin-film-transistor can be attributed to higher electric field at trench corner, i.e., the corner effects.

Flexibility of the wavy channel thin-film-transistor was tested at a bending radius (R) of 5 mm. At this bending radius, the device "ON" current was only approximately 10% lower compared with a 1 cm bending radius. Further, at the 5 mm bending radius, the device "ON" current does not degrade, gate leakage values remain below 10 nA (and did not demonstrate signs of increasing with further electric cycling), and the hysteresis in transfer characteristics remained less than 0.2V.

Saturation field effect mobility, $\mu_{sat}$ was calculated according to the MOSFET expression:

$$\mu_{sat} = \left(\frac{2L_g}{W}\right)\left(\frac{1}{C_{ox}}\right)\left(\frac{d\sqrt{I_{DS}}}{dV_{GS}}\right)$$

where $C_{ox}$ is the oxide gate capacitance per unit area, $L_g$ is the gate length, and W is the device width. The 70% higher width was accounted for in the saturation mobility calculation, which demonstrated that the wavy channel thin-film-transistor can significantly increase output current per unit chip area without compromising static power consumption. This testing also demonstrated the output characteristics did not degrade with mechanical bending as a value of $I_{ds}$=1× $10^{-3}$ A was achieved down to a 5 mm bending radius.

The wavy channel thin-film transistor and conventional coplanar thin-film-transistor were also tested for potential application in a flexible display application by mounting low power red light (640 nm) LEDs on a flexible substrate and driving the optical power outputs of the LED by the respective drive currents. Typical diode I-V characteristics of the off-the-shelf LED showed a turn-on voltage of ~1.6V. Testing the output power versus injection current demonstrated that the injection currents were 600 µA for a conventional coplanar thin-film-transistor and 1100 µA for the disclosed wavy channel thin-film-transistor. This demonstrates that the optical output of the LED operated by the disclosed wavy channel thin-film-transistor is ~2× the optical power emitted by the LED operated by a conventional coplanar thin-film-transistor, i.e. 3 mW vs. 1.5 mW, under similar gate and drain bias conditions for both devices.

Electro-luminescence (EL) measurements of the LED when driven by the respective currents of the coplanar and wavy channel thin-film-transistors were also performed. The LED driven by the disclosed wavy channel thin-film-transistor exhibited more than 2× intensity at the peak wavelength of 640 nm when compared to the LED driven by conventional coplanar thin-film-transistor, when both are biased under similar gate and drain bias conditions. This demonstrates that the disclosed wavy channel thin-film-transistor enables pixel area down-scaling and higher pixel fill factors when compared to the conventional coplanar thin-film-transistor when providing identical drive currents.

Accordingly, the disclosed wavy channel thin-film-transistor can achieve 70% higher device width within the same chip area when compared to a conventional coplanar thin-film-transistor. The disclosed wavy channel thin-film-transistor achieves 70% higher drive current, lower subthreshold slope, and lower Vi values when compared to conventional coplanar thin-film-transistors even when bent down to 5 mm bending radius.

Because the disclosed wavy channel thin-film-transistor exhibited 2X the output power when driving a flexible LED compared to a conventional coplanar thin-film-transistor, the disclosed wavy channel thin-film-transistor can occupy 70% lower area when compared to a conventional coplanar thin-film-transistor at an identical drive current, and thus enable higher pixel fill factor, as well as, higher number of pixels per inch (PPI). Thus, the disclosed wavy channel thin-film-transistor can be employed for, among other applications, future ultra-high-definition flexible displays of beyond 8K resolution. Drive current greater than 2× can be achieved with tighter fin pitches and higher aspect ratio trenches.

The disclosed embodiments provide a flexible, wavy channel thin-film-transistor. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for producing a thin-film-transistor, comprising:
   forming a flexible substrate on a rigid substrate;
   forming a plurality of fins and trenches in a structural layer arranged on the flexible substrate;
   forming a wavy gate layer, channel layer, source contact layer, and drain contact layer on each of the plurality of fins and each of a plurality of trenches of the structural layer; and
   removing the plurality of fins and trenches having the wavy gate, channel, source contact, and drain contact layers from the rigid substrate.

2. The method of claim 1, further comprising:
   forming an adhesion and etch stop layer on the flexible substrate prior to forming the structural layer on the flexible substrate.

3. The method of claim 1, wherein the plurality of trenches are formed in the structural layer using reactive ion etching.

4. The method of claim 1, further comprising:
   forming a first electrically insulating layer on each of the plurality of fins and each of the plurality of trenches prior to forming the channel layer.

5. The method of claim 4, wherein the gate layer is formed on the first electrically insulating layer prior to forming the channel layer.

6. The method of claim 5, further comprising:
   forming a second insulating layer on the gate layer prior to forming the channel layer.

7. The method of claim 6, wherein the first and second electrically insulating layers are formed using atomic layer deposition.

8. The method of claim 6, further comprising:
   etching the second insulating layer to expose gate pads of the electrically conducting layer.

9. The method of claim 1, further comprising:
   applying a photoresist passivation layer on the plurality of fins and plurality of trenches prior to removing the plurality of fins and trenches from the rigid substrate.

10. The method of claim 1, wherein sidewalls of each of the plurality of fins are non-perpendicular to a bottom of each of the plurality of trenches.

11. The method of claim 1, wherein the source and drain layers are formed subsequent to the channel layer.

12. The method of claim 1, wherein the structural layer is amorphous silicon.

13. A method for producing a thin-film transistor, comprising:
    forming a flexible substrate on a rigid substrate;

forming a plurality of fins and trenches in an amorphous silicon layer arranged on the flexible substrate;

forming a wavy gate layer on each of the plurality of fins and each of a plurality of trenches of the amorphous silicon layer;

forming a wavy channel layer on each of the plurality of fins and each of a plurality of trenches of the amorphous silicon layer;

forming a wavy source contact layer and a wavy drain contact layer on lateral ends of each of the plurality of fins and each of a plurality of trenches of the amorphous silicon layer; and removing the plurality of fins and trenches having the wavy gate, channel, source contact, and drain contact layers from the rigid substrate.

14. The method of claim 13, further comprising:

applying a photoresist passivation layer on the plurality of fins and plurality of trenches prior to removing the plurality of fins and trenches from the rigid substrate.

15. The method of 13, wherein sidewalls of each of the plurality of fins are non-perpendicular to a bottom of each of the plurality of trenches.

16. A thin-film-transistor, comprising:
 a flexible substrate;
 a structural layer attached to the flexible substrate, wherein the structural layer includes a plurality of fins and a trench between each of the plurality of fins; and
 a wavy gate layer, channel layer, source contact layer, and drain contact layer formed on the plurality of fins and the trench between each of the plurality of fins,
 wherein sidewalls of each of the plurality of fins are non-perpendicular to a bottom of each of the plurality of trenches.

17. The thin-film-transistor of claim 16, wherein a thickness of the flexible substrate is such that the thin-film-transistor achieves a bending radius down of at least 5 mm.

18. The thin-film-transistor of claim 16, wherein the structural layer is amorphous silicon.

* * * * *